United States Patent

Tsukagoshi et al.

[11] Patent Number: 6,034,331
[45] Date of Patent: Mar. 7, 2000

[54] CONNECTION SHEET AND ELECTRODE CONNECTION STRUCTURE FOR ELECTRICALLY INTERCONNECTING ELECTRODES FACING EACH OTHER, AND METHOD USING THE CONNECTION SHEET

[75] Inventors: Isao Tsukagoshi, Simodate; Yukihisa Hirosawa, Mooka; Kouji Kobayashi; Tomohisa Ohta, both of Totigi-ken; Hiroshi Matsuoka, Oyama; Itsuo Watanabe, Simodate; Kenzo Takemura, Yuuki; Naoyuki Shiozawa, Totigi-ken; Osamu Watanabe; Kazuyoshi Kojima, both of Simodate, all of Japan

[73] Assignee: Hitachi Chemical Company, Ltd., Tokyo, Japan

[21] Appl. No.: 08/681,397

[22] Filed: Jul. 23, 1996

[51] Int. Cl.[7] .................................................. H05K 1/16
[52] U.S. Cl. ........................................... 174/250; 174/260
[58] Field of Search ............................ 257/778; 174/250, 174/260, 259; 361/803; 439/91, 591

[56] References Cited

U.S. PATENT DOCUMENTS

| | | | |
|---|---|---|---|
| 4,157,932 | 6/1979 | Hirata | 156/310 |
| 5,001,542 | 3/1991 | Tankagoshi | 257/746 |
| 5,065,505 | 11/1991 | Matsubara | 29/830 |
| 5,225,966 | 7/1993 | Basavanhally et al. | 361/406 |
| 5,567,917 | 10/1996 | Hayashi | 174/258 |
| 5,622,590 | 4/1997 | Kunitomo et al. | 156/291 |
| 5,625,230 | 4/1997 | Park et al. | 257/736 |
| 5,637,176 | 6/1997 | Gilleo et al. | 156/277 |
| 5,641,996 | 6/1997 | Omoya et al. | 257/787 |

*Primary Examiner*—Kristine Kincaid
*Assistant Examiner*—Jeremy C. Norris
*Attorney, Agent, or Firm*—Wenderoth, Lind & Ponack, L.L.P.

[57] ABSTRACT

A connection sheet which firmly bonds electrodes that face each other together by interposing the connection sheet between the electrodes. The connection sheet comprises a first adhesive layer containing a first adhesive having an insulating property and a second adhesive layer placed at least on one side of the first adhesive layer and containing a second adhesive having an insulating property and a conductive material, wherein at the time of electrode connection, the second adhesive molten has a viscosity equal to or lower than that of the first adhesive when molten. When the electrodes are connected with this structure, the conductive material contained in the second adhesive layer is embedded in the first adhesive layer having relatively high melting viscosity, and part of the conductive material is trapped on the electrodes to be connected in contact therewith. Accordingly, the conductive material can be securely held between the electrodes. Further, since the region between adjacent protruding electrodes contains no air bubbles, connection reliability and excellent moisture resistance is ensured.

20 Claims, 5 Drawing Sheets

CONNECTION SHEET AND ELECTRODE CONNECTION STRUCTURE FOR ELECTRICALLY INTERCONNECTING ELECTRODES FACING EACH OTHER, AND METHOD USING THE CONNECTION SHEET

BACKGROUND OF THE INVENTION

1. Field of the Invention

The present invention relates to a connection sheet for firmly bonding an electronic component such as a semiconductor chip to a circuit board to achieve electrical connection between electrodes of the two components, and also to electrode connection structure and method using the connection sheet.

2. Description of the Related Art

With a recent trend to smaller-sized, thinner electronic components, electrical circuits used in such components have come to be increased in density and reduced in connection pitches. Since connection of an electronic component to fine electrodes is difficult to achieve with conventional techniques utilizing soldering, rubber connectors or the like, in recent years anisotropic conductive adhesives and film-like materials (connection sheets) which can provide excellent resolution are widely used.

A connection sheet comprises an adhesive having a predetermined content of an electrically conductive material, such as conducting particles. With the connection sheet interposed between an electronic component and electrodes or an electrical circuit, pressure or both heat and pressure are applied to the connection sheet, whereby the two components are firmly bonded together so that corresponding electrodes of the two components can be electrically connected to each other while providing insulation between adjacent electrodes.

The basic idea for achieving high resolution with the connection sheet is that the particle diameter of conducting particles in the vicinity of the electrodes shall be smaller than the length of an insulating region between adjacent electrodes, so as to ensure inter-electrode insulation performance. Also, the content of conducting particles in the connection sheet is selected to obtain a density such that the particles do not come into contact with one another, and that when electrodes are connected, the particles never fail to exist on the electrodes to be connected, to thereby achieve conductivity at connecting portions.

However, if the particle diameter of the conducting particles is too small, the conducting particles undergo cohesion and are united due to an excessive increase in the surface area of the particles, making it impossible to maintain required insulation performance between adjacent electrodes. On the other hand, if the content of the conducting particles is reduced, the number of conducting particles on the electrodes to be connected also decreases, with the result that conduction between corresponding electrodes cannot be achieved due to deficiency in the number of contact points. With conventional techniques, therefore, it is very difficult to achieve high resolution with a connection sheet while maintaining long-term connection reliability. Specifically, there has recently been an increasing demand for higher resolution, that is, for reduction in the area of electrodes and in the spacing between adjacent electrodes. When pressure or both heat and pressure are applied to the connection sheet in the connection step, however, the conducting particles on the electrodes flow together with the adhesive to a region between adjacent electrodes, thus impeding achievement of high resolution with the use of a connection sheet. If the viscosity of the adhesive is increased in order to suppress such outflow, then the conducting particles do not satisfactorily contact with each electrode, making it impossible to achieve electrical connection between electrodes facing each other. On the other hand, if the viscosity of the adhesive is decreased, not only the conducting particles are more likely to flow but also air bubbles are liable to be contained in the region between adjacent electrodes, lowering the connection reliability, especially, the moisture resistance.

In view of the drawbacks, Unexamined Japanese Patent Publications (KOKAI) No. 61-195179 and No. 4-366630, for example, disclose a multi-layer connection sheet including an insulating adhesive layer (first adhesive layer) and a layer (second adhesive layer) filled with conducting particles and separate from the first adhesive layer, wherein the viscosity of the second adhesive layer is selected such that the second adhesive layer exhibits relatively higher viscosity or cohesive force than the first adhesive layer at the time of connection, to lessen the flow of the conducting particles and thereby trap conducting particles on the electrodes.

According to the disclosed techniques, however, the layer filled with conducting particles has higher viscosity than the insulating adhesive layer at the time of connection; therefore, the conducting particles insufficiently contact with the electrodes, increasing the connection resistance and lowering the connection reliability. In order to reduce the connection resistance, a structure may be employed wherein the conducting particles are exposed in advance to the surfaces of the particle-filled layer so that they may be easily brought into contact with the electrodes. In this case, however, the particle diameter of the conducting particles must be increased, which makes it difficult to achieve high resolution.

There has also been proposed a connection sheet which permits connection to fine electrodes or a circuit and which provides excellent connection reliability, wherein conducting particles are concentrated at regions where electrodes are to be connected. Although this connection sheet permits connection to dot-like fine electrodes such as electrodes on a semiconductor chip, it is necessary that the particle-concentrated regions should be accurately aligned with corresponding dot-like electrodes, lowering the operation efficiency.

SUMMARY OF THE INVENTION

The present invention was created to solve the above problems, and an object thereof is to provide a connection sheet of which conducting particles can be reliably trapped between electrodes facing each other at the time of connection and can be easily brought into contact with the electrodes, and which is excellent in long-term connection reliability and in operation efficiency during electrode connection work.

According to a first aspect of the present invention, there is provided a connection sheet interposed between electrodes facing each other to join the electrodes together for electrically connecting the electrodes to each other, which comprises: a first adhesive layer made of a first adhesive having an electrical insulating property; and a second adhesive layer placed over the first adhesive layer, the second adhesive layer containing a second adhesive having an electrical insulating property and an electrically conductive material, the second adhesive having a viscosity equal to or lower than that of the first adhesive when the first and second adhesives are in a molten state.

According to the first aspect of the invention, since the viscosity of the second adhesive in a molten state is equal to or lower than that of the first adhesive, when the electrodes are connected the conductive material contained in the second adhesive layer is embedded or trapped in the first adhesive layer having relatively high melting viscosity. Thus, the conductive material can be reliably held between electrodes facing each other. As the first adhesive layer softens and flows thereafter, the conductive material comes into contact with protruding electrodes, permitting electrical conduction. The first adhesive layer has a viscosity equal to or higher than that of the second adhesive and thus can retain the conductive material, whereby no air bubbles are contained in the region between adjacent protruding electrodes.

If the viscosity of the second adhesive containing conducting particles is higher than that of the first adhesive (the difference by which the second adhesive is lower in viscosity than the first adhesive takes a negative value), the viscosity of the second adhesive is so high that the conducting particles cannot be embedded in or trapped by the first adhesive layer. Thus, the conducting particles insufficiently come into contact with the electrodes, making it impossible to achieve electrical connection between electrodes facing each other.

Preferably, when the first and second adhesives are in a molten state, the viscosity of the second adhesive is lower than that of the first adhesive by 1000 poises or less.

If the viscosity of the second adhesive is lower than that of the first adhesive by more than 1000 poises, the viscosity of the second adhesive is so low that outflow of the conducting particles occurs. Also, air bubbles are liable to be contained in the region between adjacent electrodes, lowering the connection reliability, especially the moisture resistance.

The second adhesive layer preferably has a melting viscosity of 500 poises or less.

According to the results of experiments conducted by the inventors, where the melting viscosity of the second adhesive layer itself was 500 poises or less taking account of the viscosity difference with respect to the first adhesive layer, satisfactory connection could be achieved.

The first and second adhesives preferably contain an identical material, since the adhesive strength can be enhanced due to an increase in the adhesiveness at the interface between the first and second adhesive layers.

Preferably, the first adhesive and the second adhesive have different adhesive properties.

The reason is that the connection sheet can be detached preferentially from a substrate surface at an interface with a lower adhesive strength, thus facilitating repair work.

The first adhesive layer and/or the second adhesive layer preferably contains insulating particles.

In the case where the insulating particles are contained, insulation between conducting particles or between a conducting particle and an electrode can be achieved with reliability when the electrodes are connected.

Preferably, the conductive material comprises conducting particles or conducting particles having surfaces thereof coated with an insulating material.

Where the conducting particles are coated with an insulating material, the insulating coating of only those conducting particles located at the electrode contact portion is melted, while the other portion is improved in insulation performance due to the insulating coating.

The first adhesive layer preferably includes a separator sheet which covers a surface of the first adhesive layer opposite the second adhesive layer and which can be peeled off from the first adhesive layer.

In this case, the separator sheet is peeled off when electrodes are actually connected from the first adhesive layer that is, when the connection sheet is actually used, whereby dust or the like is prevented from adhering to the connection sheet before use.

According to a second aspect of the present invention, there is provided a connection structure for joining together electrodes facing each other to electrically connect the electrodes to each other, which comprises: a first adhesive layer made of a first adhesive having an electrical insulating property; a second adhesive layer placed over the first adhesive layer, the second adhesive layer containing a second adhesive having an electrical insulating property and an electrically conductive material, the second adhesive having a viscosity equal to or lower than that of the first adhesive when the first and second adhesives are in a molten state; and a substrate disposed for contact with the first adhesive layer or the second adhesive layer, the substrate being provided with an electrode having an electrode surface to be brought into contact with the electrically conductive material, a ratio (L/D) of a longer side (L) to a shorter side (D) of the electrode surface being 20 or less.

According to the second aspect of the invention, in the connection structure for connecting electrodes formed on a substrate such as a semiconductor chip, the ratio (L/D) of the longer side to shorter side of the connection surface of each electrode on the substrate is 20 or less, in which case more conductive material can be reliably trapped on fine protruding electrodes, improving the connection reliability and permitting efficient use of expensive conductive material.

By making the viscosity of the second adhesive in a molten state equal to or lower than that of the first adhesive, as mentioned with reference to the first aspect of the invention, when the electrodes are connected, the conductive material contained in the second adhesive layer is embedded in the first adhesive layer having relatively high melting viscosity, or part of the conductive material is trapped on the electrodes to be connected in contact therewith. Thus, the conductive material can be reliably held between electrodes facing each other.

Preferably, when the first and second adhesives are in a molten state, the viscosity of the second adhesive is lower by 1000 poises or less than that of the first adhesive, as in the first aspect of the invention.

According to a third aspect of the present invention, there is provided a connection structure for joining together electrodes facing each other to electrically connect the electrodes to each other, which comprises: a first adhesive layer made of a first adhesive having an electrical insulating property; a second adhesive layer placed over the first adhesive layer, the second adhesive layer containing a second adhesive having an electrical insulating property and an electrically conductive material; and a pair of electrode rows which face each other and between which the first and second adhesive layers are interposed, at least one of the pair of electrode rows including protruding electrodes protruding from a substrate, the protruding electrodes each having a base near the substrate and a top face facing a corresponding electrode, the first adhesive layer surrounding at least the base of each of the protruding electrodes.

According to the third aspect of the invention, the first adhesive layer as an insulating adhesive layer is placed close to the electrodes protruding from the substrate, thus improving the insulation performance between adjacent electrodes as well as the resolution.

Preferably, when the first and second adhesives are in a molten state, the viscosity of the second adhesive is lower by 1000 poises or less than that of the first adhesive.

In the case where the first adhesive layer as an insulating adhesive layer has high melting viscosity, it is more unlikely that the connection pressure acts upon the region between adjacent electrodes and thus that the conductive material flows to this region, further improving the insulation performance between adjacent electrodes and the resolution.

Preferably, the conductive material of the second adhesive layer has a density such that the density gradually decreases with distance from the top face of each protruding electrode toward the base near the substrate.

The higher the density of the conductive material at the top face or connection surface of the electrode, the more reliable the electrical connection is achieved. For the base side of the electrode, on the other hand, the lower the density of the conductive material, the more reliable the adjacent electrodes are insulated from each other.

According to a fourth aspect of the present invention, there is provided a connection method for joining together electrodes facing each other to electrically connect the electrodes to each other, which comprises: the arranging step of interposing a connection sheet including a first adhesive layer and a second adhesive layer between a pair of electrode rows such that the pair of electrode rows face each other, the first adhesive layer being made of a first adhesive having an electrical insulating property and a thermosetting property, the second adhesive layer being placed over the first adhesive layer and containing an electrically conductive material and a second adhesive having an electrical insulating property and a thermosetting property; and the heat-pressure application step of heating the first and second adhesive layers under pressure, the heat and/or pressure applied to the second adhesive during the heat-pressure application step being lower than the heat and/or pressure applied to the first adhesive.

According to the fourth aspect of the invention, the heat or/and pressure applied to the second adhesive containing the conducting particles is lowered, whereby at the time of connection, the viscosity of the second adhesive having a thermosetting property can be made to be equal to or lower than that of the first adhesive also having a thermosetting property.

Therefore, the viscosity of the second adhesive in a molten state at the time of connection can be made to be smaller than that of the first adhesive layer, as mentioned above with reference to the first aspect of the invention, whereby at the time of electrode connection, the conductive material in the second adhesive layer is embedded in the first adhesive layer having relatively high melting viscosity, or part of the conductive material is trapped on the electrodes to be connected in contact therewith. Thus, the conductive material can be reliably held between the electrodes facing each other. Further, since the viscosity of the first adhesive layer is high relative to that of the second adhesive, not only the conductive material 3 can be trapped but also no air bubbles are contained in the region between adjacent protruding electrodes.

Preferably, in the heat-pressure application step, the first and second adhesive layers are heated under pressure such that the second adhesive is lower in viscosity by 1000 poises or less than the first adhesive when the first and second adhesives are in a molten state.

Also, in the heat-pressure application step, the connection sheet is preferably heated under pressure with a heat source arranged close to the first adhesive layer.

In the case where the heat source is arranged close to the first adhesive layer and a thermosetting resin is used for each of the adhesive layers, the viscosity of the second adhesive which is remote from the heat source becomes lower than that of the first adhesive.

According to a fifth aspect of the present invention, there is provided a connection method for joining together electrodes facing each other to electrically connect the electrodes to each other, which comprises: the arranging step of interposing a connection sheet including a first adhesive layer and a second adhesive layer between a pair of electrode rows such that the pair of electrode rows face each other, the first adhesive layer being made of a first adhesive having an electrical insulating property and a thermosetting property, the second adhesive layer being placed over the first adhesive layer and containing an electrically conductive material and a second adhesive having an electrical insulating property and a thermosetting property; the first heat-pressure application step of heating the second and first adhesive layers under pressure such that the electrically conductive material comes into contact with each pair of electrodes facing each other while the first and second adhesives are in a molten state, thereby permitting electrical connection of each electrode pair; the current supply inspection step of inspecting electrical conductivity of each electrode pair; and the second heat-pressure application step of again heating the first and second adhesive layers under pressure after the current supply inspection step to harden the adhesives.

According to the fifth aspect of the invention, the heat-pressure application step is divided into two stages or more so that the current supply inspection step and/or a repair step for connected electrodes may be carried out as needed between the stages, whereby the operation efficiency and the product quality can be improved.

Preferably, the current supply inspection step is performed while the cohesive force of the first adhesive and/or the second adhesive is increased to such an extent that connection of the electrodes can be maintained.

In this case, with the connection structure maintained as it is, the current supply inspection can be carried out with ease and reliability.

The cohesive force can be increased by partially accelerating the hardening reaction of the adhesives by heating, or by making the temperature of the connecting portion lower than the connection temperature to thereby increase the modulus of elasticity, for example.

The current supply inspection step is preferably performed while pairs of electrodes are kept under pressure so that connection of the electrodes can be maintained to allow electrical connection.

Also in this case, the current supply inspection can be easily and reliably carried out.

Preferably, in the first heat-pressure application step, the first and second adhesive layers are heated under pressure such that the second adhesive has a viscosity equal to or lower than that of the first adhesive when the first and second adhesives are in a molten state.

By making the viscosity of the second adhesive in a molten state equal to or lower than that of the first adhesive, as mentioned above with reference to the first aspect of the invention, at the time of electrode connection, the conductive material in the second adhesive layer is embedded in the first adhesive layer having relatively high melting viscosity, or part of the conductive material is trapped on the electrodes to be connected in contact therewith. Thus, the conductive material can be reliably retained on the electrodes to be connected.

DESCRIPTION OF THE PREFERRED EMBODIMENTS

The present invention will be hereinafter described with reference to the drawings.

Figure 1:
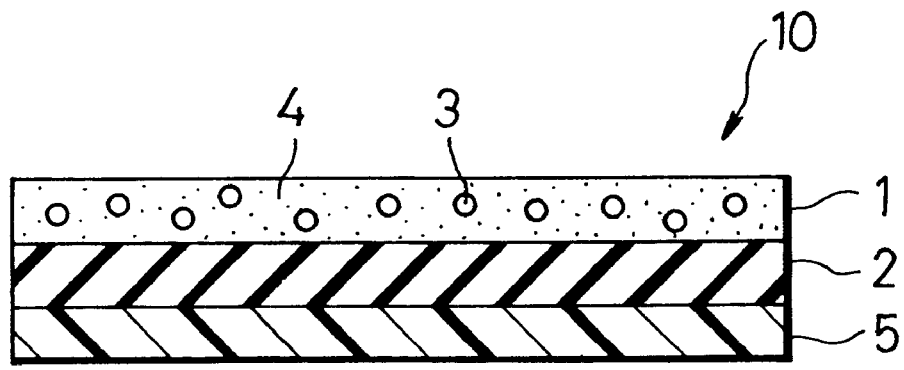
FIG. 1 is a sectional view schematically showing a connection sheet according to the present invention.

FIG. 1 schematically shows a section of a connection sheet 10 according to one embodiment of the present invention. The connection sheet 10 of the present invention is a multi-layer sheet including a first adhesive layer 2 and a second adhesive layer 1.

The second adhesive layer 1 is made of an electrically conductive material 3 and a second adhesive 4, and has electrical conductivity in the direction of application of pressure (thickness direction), that is, anisotropic conductivity.

The first adhesive layer 2 is formed on one side of the second adhesive layer and has an electrical insulating property.

Figure 2:
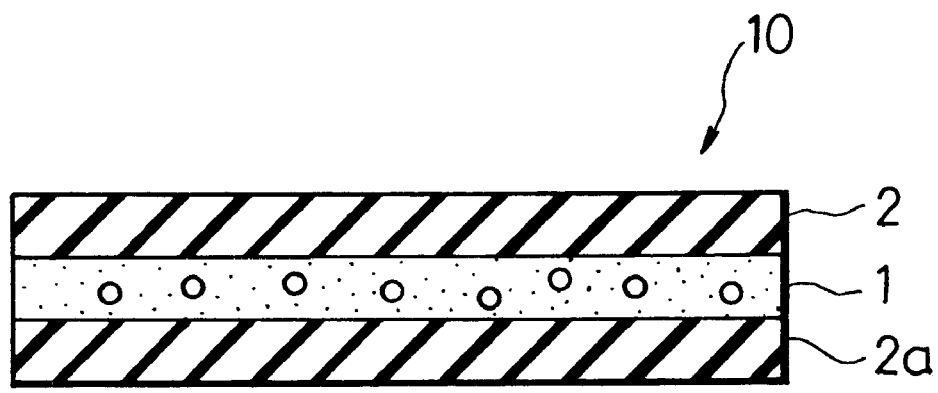
FIG. 2 is a sectional view schematically showing another connection sheet according to the present invention.

As shown in FIG. 2, the first adhesive layer 2 having an insulating property may be formed on each side of the second adhesive layer 1. Further, although not shown in FIGS. 1 and 2, more first adhesive layers 2 may be used to obtain a connection sheet of multi-layer structure in order to enhance properties such as adhesive property.

A peelable separator 5 may be affixed as needed to a surface of the connection sheet made up of the first and second adhesive layers 2 and 1, as shown in FIG. 1, to remove unnecessary tackiness and to prevent dust and the like from adhering to the connection sheet. Although not shown, the separator 5 may be affixed to the side of the second adhesive layer 1, instead of the first adhesive layer 2, or may be affixed to both sides.

In the case of the connection sheet 10 shown in FIG. 1, the separator 5 is in contact with the first adhesive layer 2 having an insulating property; therefore, when the connection sheet is temporarily affixed to a substrate with flat electrodes, for example, the sheet can be affixed with the second adhesive layer 1 facing the flat-electrode side having small unevenness, thus facilitating the connection and improving the operation efficiency. Preferably, the separator 5 is in the form of continuous tape, in which case the connection step can be continuously and automatically performed.

FIG. 3 schematically shows various sections of the second adhesive layer 1 having electrical conductivity in the direction of application of pressure. The second adhesive layer 1 is made of the second adhesive 4 containing the electrically conductive material 3, as mentioned above. For the conductive material 3, conducting particles can be used, and their particle size and shape may be modified in various ways, as shown in FIGS. 3A through 3G. Among these, a preferred particle diameter is such that the conductive material 3 can form a single particle layer perpendicular to the thickness direction of the second adhesive 4, that is, a preferred particle diameter is nearly equal to the thickness of the second adhesive 4, as shown in FIGS. 3C to 3E; in this case, the conductive material 3 can be easily trapped on electrodes because it does not flow freely during the connection step. In cases where the particle diameter of the conductive material 3 is nearly equal to the thickness of the second adhesive 4, electrical conduction can be easily achieved by simply bringing the adhesive layer into contact with electrodes.

Preferably, the proportion of the conductive material 3 to the second adhesive 4 is about 0.1 to 20% by volume, more preferably, 1 to 15% by volume in order to easily achieve anisotropic conductivity. Also, to make it easy to obtain electrical conductivity in the thickness direction to thereby achieve high resolution, the second adhesive layer 1 should preferably have the smallest possible thickness available by a film formation process. The thickness of the second adhesive layer 1 is preferably 20 $\mu$m or less, more preferably, 10 $\mu$m or less.

Figure 3A:
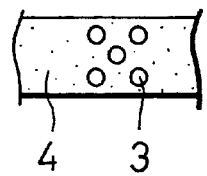
FIGS. 3A through 3G illustrate sections of various conductive adhesive layers used in the present invention.
Figure 3B:
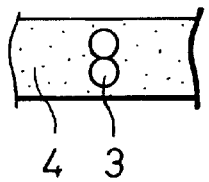
Figure 3C:
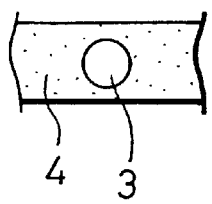
Figure 3D:
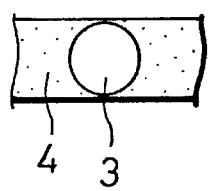
Figure 3E:
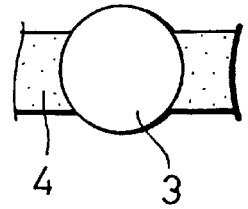
Figure 3F:
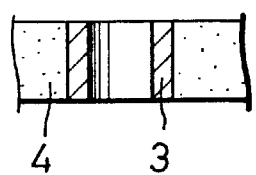
Figure 3G:
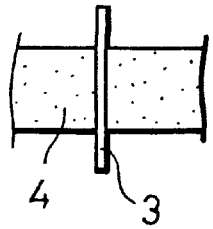

The conductive material 3 preferably comprises spherical particles with various sizes located in various ways with respect to the second adhesive layer 1, as shown in FIGS. 3A to 3E, for example, because such conducting particles can be easily produced and also because of availability. Alternatively, the conductive material 3 may be a conductor plated over the inner peripheral surface of a through hole cut in the second adhesive 4, as shown in FIG. 3F, or may be a conducting fiber, such as wire, penetrating the second adhesive 4 in the thickness direction, as shown in FIG. 3G.

Particles to be used as the conductive material 3 include metal particles of Au, Ag, Pt, Ni, Cu, W, Sb, Sn, solder etc., carbon particles and the like. Further, such conducting particles or macromolecular particles made of a nonconductive material, such as glass, ceramic material or plastic material, may be used as cores, which are then coated with an electrically conductive layer using one of the aforementioned substances.

Alternatively, for the conductive material 3, insulator-coated particles having the aforementioned conductive cores coated with an insulating layer may be used, or insulating particles of glass, ceramic material or plastic material may be mixed in the second adhesive 4 together with the conducting particles (conductive material) 3. In such cases, the second adhesive layer serves to enhance the resolution.

In connection with the conductive material 3, it is necessary that one or more conducting particles, more preferably, as many particles as possible, should be in contact with a fine electrode. In view of this, the particle diameter of the conducting particles should preferably be as small as 15 $\mu$m or less, more preferably, in the range of 7 to 1 $\mu$m both inclusive. If the particle diameter is smaller than 1 μm, it difficult to achieve contact with electrodes.

The conducting particles as the conductive material 3 should preferably be uniform in particle diameter. Uniform particle diameter serves to lessen the outflow of conducting particles from between electrodes facing each other at the time of connection.

For the conductive material 3, particles having macromolecular cores of plastic material coated with a conductive layer or particles of heat-fusible metal such as solder are preferably used. This is because these materials deform when applied with heat or pressure, so that the area of contact with an electrode increases due to the deformation during the connection step, thus improving the reliability. In the case of using macromolecular cores in particular, the particles do not show extreme flowability when the melting point is reached, unlike solder, whereby the softened state can advantageously be controlled over a wide range of connection temperature and unevenness in the thickness or flatness of electrodes can be easily coped with.

Other preferred conductive materials include hard metal particles of Ni, W or the like, and particles having a large number of protuberances on their surface. This is because, when the connection sheet is bonded to electrodes, the conducting particles stick into the electrodes or a wiring pattern (electrode), and thus low connection resistance is achieved even if an oxide film or a contamination layer exists, thereby improving the reliability.

The second adhesive 4 and an adhesive (first adhesive) of the first adhesive layer 2 may be made out of a variety of thermoplastic materials and materials that cure upon exposure to heat or light. The materials used should preferably have high adhesiveness. Among the adhesives mentioned, hardening materials are preferred because of their excellent heat resistance and moisture resistance after the connection step. Epoxy adhesives containing a latent hardener are especially preferred because they cure in a short time, thus improving the efficiency of the connection work, and also have excellent adhesiveness due to their molecular structure. Latent hardeners have relatively clear activation points at which the reaction is initiated due to heat and/or pressure, and thus are preferably used since the present invention involves application of heat and/or pressure.

A hardener used in the present invention preferably has an activation temperature of 40 to 200° C. If the activation temperature is lower than 40° C., the temperature difference between the activation temperature and room temperature is so small that lower-temperature keeping is required; on the other hand, if the activation temperature exceeds 200° C., other connecting elements are affected by heat. For this reason, the preferred range of activation temperature is 50 to 150° C. The activation temperature referred to in the present invention indicates a peak temperature of a sample mixture of an epoxy resin and a hardener, which is measured using a DSC (differential scanning calorimeter) while the mixture is gradually heated at a rate of 10° C./minute from room temperature. The activation temperature is determined taking account of the fact that a hardener with a low activation temperature is excellent in reactivity but has poor shelf life.

Epoxy adhesives generally available are those which contain, as a main component(s), a macromolecular type epoxy resin; a solid epoxy resin and a liquid epoxy resin; or an epoxy resin modified using urethane, polyester, acrylic rubber, NBR (nitril-butadiene rubber), silicone, nylon or the like; and which are admixed with a hardener, a catalyst, a coupling agent, a filler, etc.

The second adhesive 4 and the first adhesive of the first adhesive layer 2 according to the present invention preferably contain 1% or more of a common material, more preferably, 5% or more of a common material, in their respective adhesive compositions. This is because the adhesive strength at the interface between the first and second adhesive layers 2 and 1 can be enhanced. As the common material, the main component, hardener, etc. may be used for higher effectiveness.

A feature of the present invention resides in that when the second adhesive 4 is in a molten state during the connection step, its viscosity is lower than that of the adhesive of the first adhesive layer 2. This feature will be explained with reference to FIGS. 4 and 5.

Figure 4:
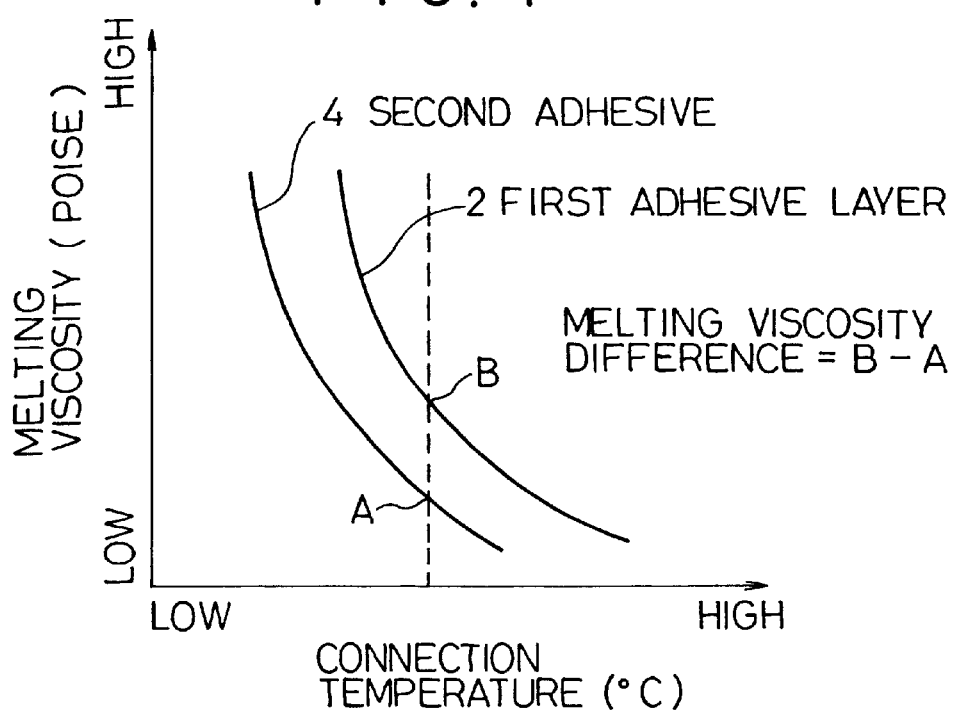
FIG. 4 is a graph showing the relationship between melting viscosity and connection temperature of an adhesive layer according to the present invention.

FIG. 4 is a graph schematically showing the relationships between temperature and viscosity of the second adhesive 4 and the first adhesive layer 2 during the heating step. According to the present invention, at the temperature for connection of electrodes (indicated by the dashed line in the figure), the second adhesive 4 (indicated at A in the graph) has a viscosity equal to or lower than the first adhesive of the first adhesive layer 2 (indicated at B in the graph), and the difference in viscosity by which A is smaller than B at this time is 1000 poises or less, more preferably, 1 to 200 poises. If the viscosity difference is greater than 1000 poises, it is likely that the conductive material 3 and electrodes will insufficiently contact with each other. Also, the viscosity of the second adhesive 4 itself becomes so low that the outflow of the conducting particles is caused, and air bubbles are liable to be contained in the region between adjacent electrodes, lowering the connection reliability, especially the moisture resistance.

If the viscosity of the second adhesive 4 is higher than that of the first adhesive layer 2 (the aforementioned viscosity difference takes a negative value), then the relative viscosity of the second adhesive 4 to the first adhesive layer 2 is so high that the conducting particles and electrodes will insufficiently contact with each other, making it impossible to connect electrodes facing each other.

Namely, in view of the balance between electrode connection and flowability, there is a preferable range for the viscosity difference that permits the conducting particles to be trapped on electrodes and also ensures effective contact of the particles with the electrodes, as explained later with reference to FIG. 5. When the connection is performed, the viscosity of the second adhesive 4 in the second adhesive layer 1 should preferably be 500 poises or less, while the viscosity of the first adhesive layer 2 should preferably be 1000 poises or less.

Preferably, the temperature for the connection is about 50 to 300° C. from a practical viewpoint. If the connection temperature is lower than 50° C., the reaction rate of the adhesives is slow, lowering the efficiency of mass production; if the connection temperature is higher than 300° C., surrounding elements such as substrates are likely to be damaged by heat. Taking account of this as well as the activation temperature of the hardener used, the connection temperature is determined. A more preferable range of the connection temperature is approximately 70 to 250° C.

FIG. 5 illustrates a connection process using the connection sheet 10 according to the present invention.

The embodiment of FIG. 5 shows a connection structure wherein a protruding electrode (bump) 12 of a semiconductor substrate 11 and a flat electrode 13 of a substrate 11a are connected to each other.

Figure 5A:
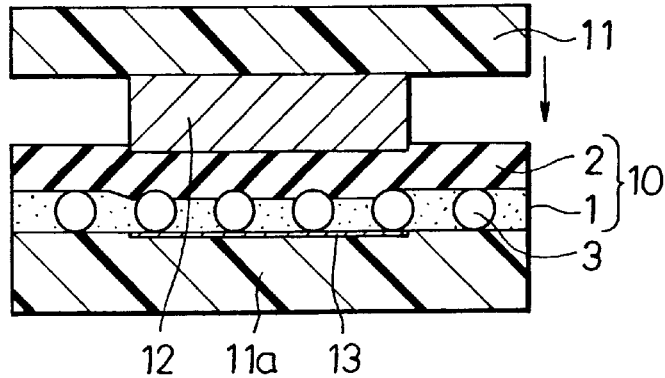
FIGS. 5A and 5B are sectional views illustrating a connection step according to the present invention.

In a contact process shown in FIG. 5A, the electrode 12 is pressed into the surface of the first adhesive layer 2 having an insulating property, whereupon the conductive material 3 becomes embedded in or part thereof is trapped by the first adhesive layer 2 having relatively high viscosity in a molten state, so that the position of the conductive material 3 is fixed. Subsequently, in a flow process shown in FIG. 5B, the conductive material 3 comes into contact with the protruding electrode 12 as the first insulating adhesive layer 2 softens, whereby electrical conduction can be established between the protruding electrode 12 and the flat electrode 13 of the substrate 11a with which the conductive material 3 also contacts. In this state, the first adhesive layer 2 serves to retain the conductive material 3 and also to connect adjacent protruding electrodes 12, 12 to each other with no air bubbles contained in the region between the adjacent protruding electrodes.

Preferably, in this case, the connection sheet 10 is placed such that the first adhesive layer 2 faces the protruding electrodes 12, in order to promote the softening of the first adhesive layer 2. Also, the connection sheet 10 is preferably heated under pressure with a heat source arranged on the first adhesive layer side so that the viscosity of the second adhesive 4 may be lower than that of the first adhesive layer 2.

It is desirable that the heat-pressure application step be divided into two or more stages so that a current supply inspection step and/or a repair step can be carried out as needed between divided stages of the heat-pressure application step. By dividing the heat-pressure application step into two or more stages, it is possible to control the viscosity in the flow process which accompanies the curing reaction of the thermosetting adhesives, thus permitting satisfactory connection free of air bubbles. In addition, repairability, which is a problem with hardening adhesives, can be imparted to the adhesives.

The current supply inspection step can be performed with the cohesive force of the connection sheet 10 increased to such an extent that the connected electrode 12 can be held in position or with pressure applied to the electrode connecting portion. The cohesive force of the connection sheet can be increased by partially accelerating the hardening reaction of the adhesives by heating, or by making the temperature of the connecting portion lower than the connection temperature to thereby increase the modulus of elasticity, for example. The current supply inspection can be implemented, for example, by extending lead wires from the respective electrodes 12 and 13 and then measuring the connection resistance or conducting a performance test.

In the current supply inspection step, visual inspection of the state of contact between the conductive material 3 and the electrode 12, 13 may also be performed independently or in combination.

The repairability indicates a property that permits the adhesive to be cleaned by removing superfluous adhesive by means of a solvent or the like, thereby making it possible to again connect the electrodes. Generally, after a hardening adhesive has cured, a network structure develops and makes the adhesive unfusible by heat and insoluble to a solvent or the like, posing a conventionally known problem whereby cleaning is very difficult to perform. Therefore, in the first stage of the heat-pressure application step, current supply inspection is carried out on both electrodes while the connection sheet is in a state such that the conductive material 3 is in contact with the protruding electrode 12 and thus electrical conduction can be established between the protruding electrode 12 and the flat electrode 13, for example. If, at this time, defective electrode connection is discovered, the connecting portion is immediately repaired, followed by reconnection. When the first stage is complete, both of the adhesives 2 and 4 are in an uncured or insufficiently cured state; therefore, the electrode can be easily peeled off and the adhesive can be readily immersed in a solvent, facilitating the repair work.

The method of measuring the melting viscosity is not particularly limited insofar as the viscosity of the second adhesive 4 and of the first adhesive layer (first adhesive) 2 can be compared with each other. Preferably, however, the same measuring method should be used, and an ordinary rotational viscometer capable of measurement at high temperatures, for example, can be used. In the case of using a thermosetting composition, for example, in which the reaction progresses and thus the viscosity varies during the measurement, the values measured using a model composition from which the hardener is removed can be employed.

Methods generally employed to obtain a difference in melting viscosity between the second adhesive 4 and the first adhesive layer 2 at the time of connection include suitably combining intrinsic viscosities by means of the molecular weights of materials or the entanglement of molecules, suitably selecting a filler as a thickener, and controlling the difference in reaction rate between hardener systems.

To produce the connection sheet according to the present invention, the second adhesive layer 1 and the first adhesive layer 2 may be laminated together or be successively coated one upon the other to obtain a laminate, for example.

Other electrode connection structures using the connection sheet 10 according to the present invention and a method of producing the same will be now explained with reference to FIGS. 6 to 8.

Figure 6:
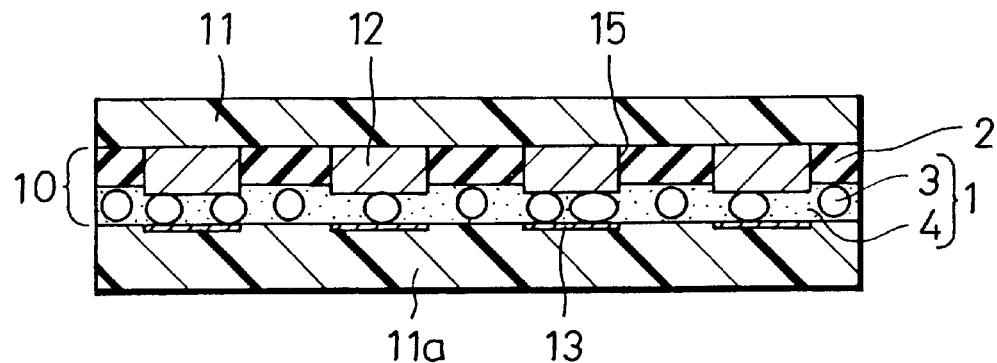
FIG. 6 is a sectional view schematically showing an example of electrode connection structure using a connection sheet according to the present invention.

FIG. 6 illustrates a structure wherein protruding electrodes 12 formed on a chip substrate 11 are connected to corresponding flat electrodes 13 of a substrate 11a through the connection sheet 10 according to the present invention. Specifically, in this connection structure, at least one of a pair of electrode rows facing each other is projected, the conductive material 3 is interposed between the protruding electrode 12 and the corresponding flat electrode 13 facing each other, and the density of the conductive material 3 in the second adhesive layer 1 is distributed such that the density in a region between the protruding electrode 12 and the corresponding flat electrode 13 is higher than that in a region (15) around the protruding electrode 12. Also, the first adhesive layer 2 as an insulating layer surrounds at least the outer peripheral portion 15 of a base of each protruding electrode 12 from the level of the chip substrate 11. This serves to enhance the insulation performance between adjacent protruding electrodes 12, 12. Further, the density of conducting particles is desirably increased at a connecting portion between each protruding electrode 12 and the corresponding flat electrode 13, in order to achieve reliable connection between the protruding electrode 12 and the flat electrode 13.

The flat electrodes 13 are flush with the surface of the chip substrate 11a or have a very small difference of height of several micrometers or less with respect to the chip substrate. Such electrodes are typically formed by an additive process or a thin-film formation process.

Figure 7:
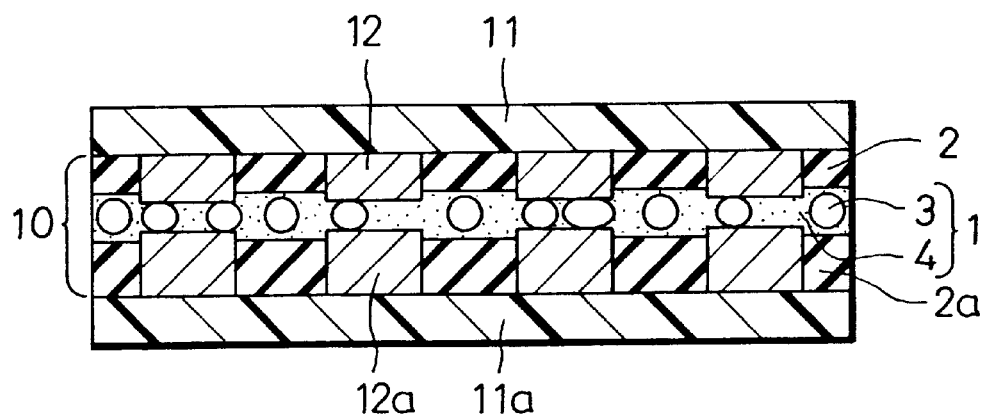
FIG. 7 is a sectional view schematically showing another example of electrode connection structure using a connection sheet according to the present invention.

FIG. 7 illustrates the case wherein protruding electrodes 12 formed on one chip substrate 11 are connected to corresponding protruding electrodes 12a formed on another chip substrate 11a. The connection sheet 10 used in this connection structure includes a second adhesive layer 1 and two first adhesive layers 2 and 2a affixed to both sides of the second adhesive layer 1, respectively, like the connection sheet 10 shown in FIG. 2. The first adhesive layers 2 and 2a surround the peripheral portions of bases of the respective protruding electrodes 12 and 12a and are in contact with the surfaces of the respective chip substrates 11 and 11a from which the electrodes 12 and 12a protrude. The embodiment shown in FIG. 7 also ensures reliable insulation performance between adjacent electrodes.

Figure 8:
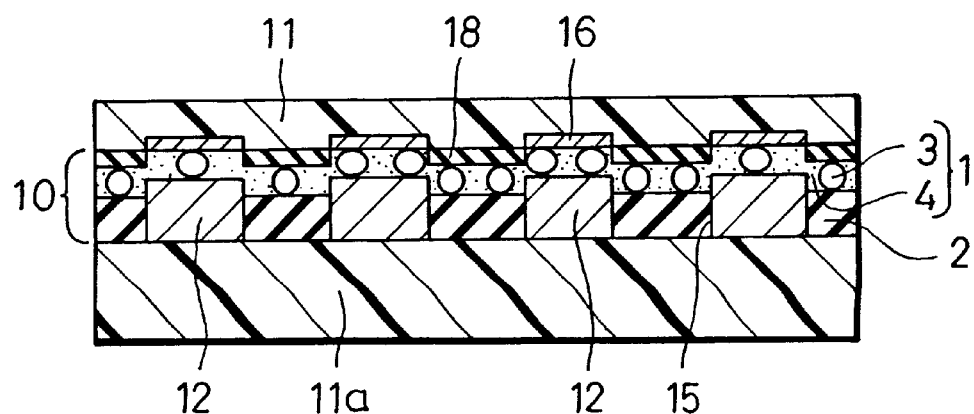
FIG. 8 is a sectional view schematically showing still another example of electrode connection structure using a connection sheet according to the present invention.

In the embodiment shown in FIG. 8, a connection structure is employed wherein one chip substrate 11 is provided with recessed electrodes 16 while another chip substrate 11a is provided with protruding electrodes 12. In this connection structure, the recessed electrodes 16 may be replaced by the aforementioned flat electrodes 13 shown in FIG. 6.

An example of the recessed electrode 16 is an Al (aluminum) pad or the like which shows itself before a protruding electrode (bump) is formed on a semiconductor chip etc., for example, and an unnecessary portion of the Al pad is covered with an insulating layer 18. The insulating layer 18 is made of silica, silicon nitride, polyimide, etc., and generally has a thickness of several micrometers. In addition to the advantage mentioned above with reference to the foregoing embodiments, this connection structure shown in FIG. 8 can advantageously reduce the cost because it is unnecessary to form protruding electrodes on a chip or the like.

In the embodiments shown in FIGS. 6 to 8, the second adhesive layer 1 and the first adhesive layer 2 have a clear boundary therebetween, but may be mixed with each other at their interface.

Figure 9:
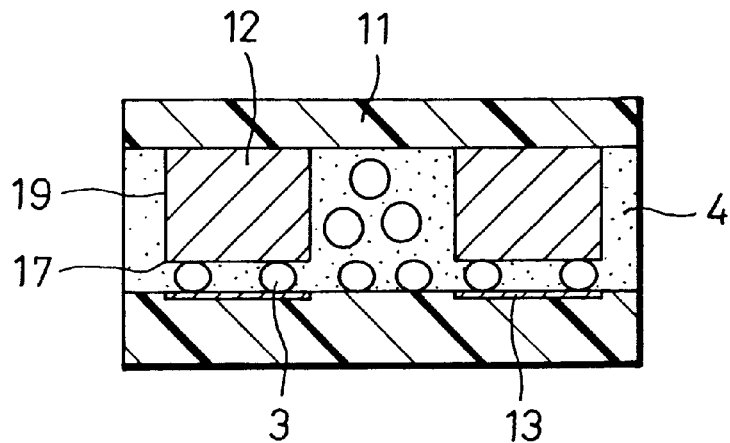
FIG. 9 is a sectional view schematically showing a further example of electrode connection structure using a connection sheet according to the present invention.

Further, as shown in FIG. 9, the conductive material 3 contained in the first adhesive layer 2 may have a density such that the density gradually lowers with distance from the top 17 of each protruding electrode 12 toward the base 19 near the substrate 11. In this case, the higher the density of the conductive material in the vicinity of the top face 17 which is an electrode connection surface, the more reliably electrical connection can be achieved. Also, the lower the density of the conductive material in the vicinity of the base 19, the higher insulation performance is ensured between adjacent electrodes 12, 12.

In the embodiments shown in FIGS. 6 to 8, the chip substrate 11 may comprise a semiconductor based on silicon, gallium arsenide, gallium phosphide, quartz, sapphire, garnet, ferrite, etc.

For the substrate 11a, inorganic materials such as a plastic film of polyimide, polyester or the like, a glass fiber-epoxy composite material, a silicon-based semiconductor, glass, ceramic material, etc. can be used, for example.

The protruding electrodes 12, 12a to be connected may include various circuits and terminals, in addition to bumps. Also, the various electrodes etc. shown in the embodiments of FIGS. 6 to 8 may be suitably combined as desired.

The electrode surfaces of the protruding electrodes 12, 12a on the chip substrate 11, 11a will be now explained.

In the protruding electrodes 12, 12a on the chip substrate 11, 11a the ratio (L/D) in length of the longer side to the shorter side of the connection surface of each electrode on a semiconductor chip should preferably be 20 or less. This is because the results of experiments described later revealed that where the ratio L/D was within the above range, conducting particles could be satisfactorily trapped on electrodes after the connection using the connection sheet 10 according to the present invention.

Figure 10:
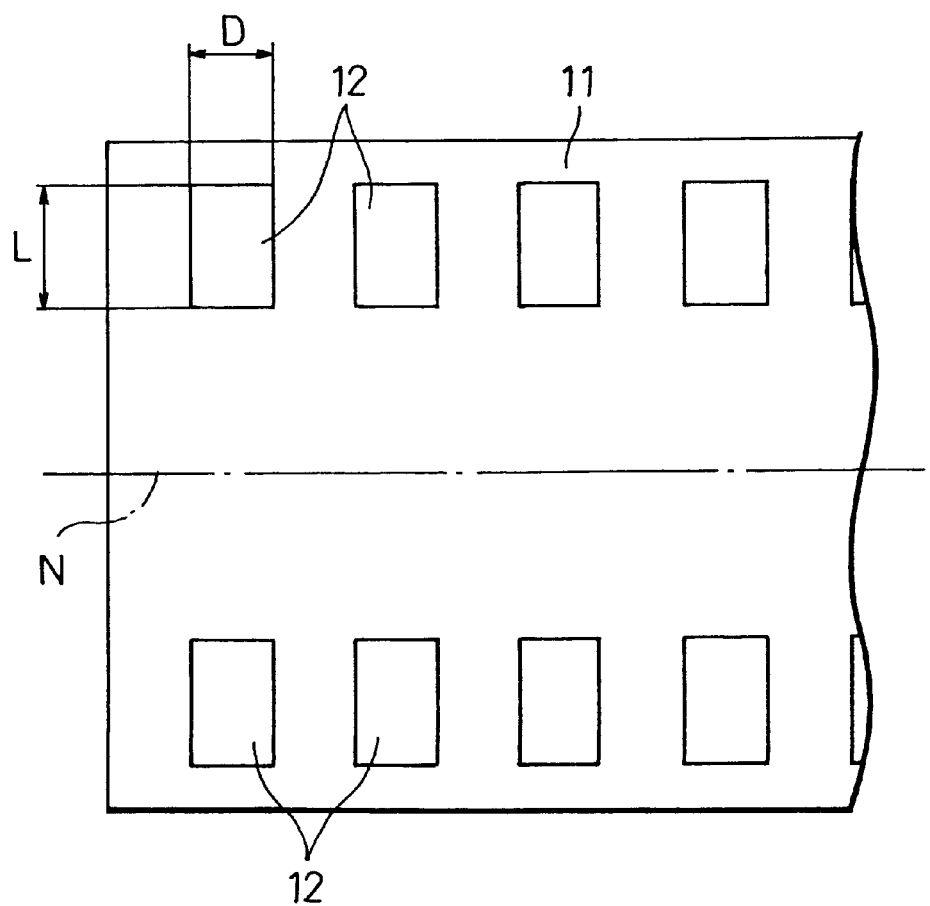
FIG. 10 is a plan view of an electrode-side face of a semiconductor chip, illustrating L/D of electrodes on a substrate.

As clearly shown in FIG. 10, the ratio L/D represents the ratio of the longer side L to the shorter side D of the connection surface of an electrode on a semiconductor chip.

Where the longer side-to-shorter side ratio L/D of the connection surface of an electrode on a semiconductor chip or the like is small, high connection reliability is ensured because many conducting particles 3 can be trapped on each fine protruding electrode 12, and also resources can be saved because of efficient use of expensive conductive material.

The reason why the structure of the multi-layer connection sheet and the longer side-to-shorter side ratio L/D of the electrode connection surface are closely related with the property of trapping conducting particles 3 on electrodes facing each other after the connection step has not been made clear, but presumably the trapping property is influenced by the directionality of the adhesive flow and the heat transmission property.

Also in this case, during the connection step, the melting viscosity of the second adhesive 4 is relatively lower than that of the first insulating adhesive layer 2 by 1000 poises or less.

According to the present invention, the conductive material 3 can be reliably trapped on the protruding electrodes 12, thus permitting electrical conduction, so that the reliability of continuity test is enhanced. The continuity test can be conducted while the adhesives are in an uncured or insufficiently cured state, whereby the repair work is facilitated.

In the various embodiments described above, the connection sheet is placed so that the first adhesive layer 2 may face the protruding electrodes 12, whereby the insulation performance between adjacent protruding electrodes 12, 12 and also the resolution can be improved. In addition, in the case where the first adhesive layer 2 has high melting viscosity, the conductive material 3 is more unlikely to flow to the region between adjacent electrodes, because the second adhesive layer 1 is not applied with pressure at the time of connection. Also, the conductive material 3 of the second adhesive layer 1 is uniformly distributed in the second adhesive along the surface, and therefore, it is unnecessary to position the conducting particles with accuracy relative to the electrodes, thus improving the operation efficiency.

Further, the first adhesive layer 2 and the second adhesive layer 1 can be appropriately combined to obtain desired adhesiveness matching their purpose, for example, matching the material of the electrode substrate used, whereby the option of usable materials is expanded, and also the connection reliability is enhanced because of reduction of air bubbles in the connecting portion, etc. One of the adhesive layers may have solubility to a solvent or swell characteristics or the two adhesive layers may have different heat resistances, in which case the repairability can be imparted which permits the connection sheet to be peeled off preferentially from one substrate surface and also permits reconnection. Also, the adhesive layers can be suitably combined so as to match the material of the electrode substrate used, facilitating the contact between each electrode and conducting particles and simplifying the production process. Further, part of the adhesive layer that has been forced out of the connecting portion serves as a sealing material, which provides reinforcement and moisture-proof effect.

EXAMPLES

Various examples according to the present invention are described in detail below, but it should be noted that the present invention is not limited to these examples alone.

Example 1

(1) Preparation of Second Adhesive Layer 1

A solution containing 30% of ethyl acetate was obtained by mixing, in the ratio of 30/70, a phenoxy resin (polymeric epoxy resin) (PKHA from Union Carbide Corporation) and a liquid epoxy resin (NOVACURE HX-3921 from Asahi Chemical Industry Co., Ltd.; epoxy equivalent: 185; activation temperature: 118° C.) containing a microcapsule latent hardener. To this solution was added 8% by volume of conducting particles, which were obtained by coating polystyrene particles (GELPACK from Hitachi Chemical Co., Ltd.) having a particle diameter of 4±0.2 $\mu$m with Ni/Au in thicknesses of 0.2/0.02 $\mu$m, followed by mixing and dispersion of the conducting particles. The dispersion was applied to a separator (polyethylene terephthalate film treated with silicone; thickness: 40 $\mu$m) by means of a roll coater, and the separator applied with the dispersion was dried at 110° C. for 20 minutes to obtain a second adhesive layer with a thickness of 5 $\mu$m. Using a model composition from which the hardener had been removed, the viscosity of the adhesive layer was measured by a digital viscometer HV-8 (manufactured by Rhesca Co., Ltd.), and was 80 poises at 150° C.

(2) Preparation of First Adhesive Layer 2 and Fabrication of Connection Sheet 10

The phenoxy resin (polymeric epoxy resin) and the liquid epoxy resin (epoxy equivalent: 185) containing a microcapsule latent hardener, which were used in preparing the aforementioned second adhesive layer 1, were mixed in the ratio of 40/60, and with no conducting particles 3 added, a sheet of 15 $\mu$m thick was produced in the same manner as the second adhesive layer 1.

Subsequently, the second adhesive layer 1 and a first adhesive layer 2 produced in the above manner were rolled between rubber rollers and laminated together at their bonding surfaces. As a result, a multi-layer connection sheet 10 including two layers and having a thickness of 20 $\mu$m as shown in FIG. 1 was obtained. Following the method mentioned in (1) above, the viscosity of the first adhesive layer 2 was measured and was 280 poises at 150° C.

Therefore, the difference in viscosity at 150° C. between the second adhesive layer 1 containing the conductive material and the first adhesive layer 2 having an insulating property was 200 poises.

(3) Connection to Electrodes The connection sheet was used to connect an IC chip for evaluation (2×12 mm silicon substrate having a height of 0.5 mm and having 300 gold electrodes (called bumps) of 50 $\mu$m in diameter and 20 $\mu$m high formed near each of the two longer sides of the substrate) and flat electrodes on a 1.1-mm thick glass substrate having a thin-film circuit of a 0.2-$\mu$m thick indium oxide film (ITO (indium-tin oxide); surface resistivity: 20 $\Omega$) formed thereon. Specifically, the ITO electrodes on the glass substrate were made to correspond in size to the bump electrodes 12 of the IC chip, and leads for measurement were extended to the outside of the substrate. The connection sheet 10 was cut to a size of 2.5×14 mm so as to be slightly greater than the size of the IC chip, and was temporarily bonded to the substrate in a manner such that the second adhesive layer 1 faces the flat electrodes 13 (cf. FIG. 5A).

When the connection sheet 10 was thus temporarily bonded to the substrate, it could be bonded with ease and also the subsequent peeling of the separator could be easily performed, because of smoothness of the substrate 11a and tackiness of the connection sheet 10.

Figure 5B:
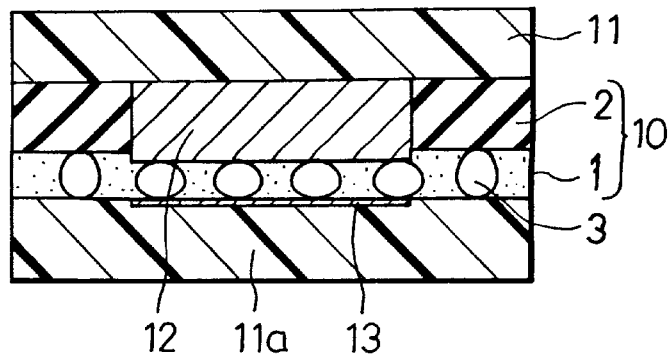

Then, with the protruding electrodes (bumps) 12 of the IC chip accurately positioned with respect to the flat electrodes 13, the entire structure was heated at 150° C. for 15 seconds under a pressure of 30 kgf/mm$^2$, thereby obtaining a connected body (cf. FIG. 5B). At this time, the structure was placed such that the insulating adhesive layer was located closer to the heat source of the connecting apparatus, with the second adhesive layer 1 facing the flat electrodes.

(4) Evaluation

A cut face of the connected body obtained in the above manner was polished and observed using a microscope, and it had a connection structure as shown in FIG. 6. It was noted in particular that the region between adjacent electrodes 12, 12 contained no air bubbles and that the particles in this region were spherical. However, the particles present between the top face 17 of each protruding electrode 12 and the corresponding flat electrode 13 had been deformed by compression, and were in contact with and held between the top face 17 of the protruding electrode 12 and the flat electrode 13.

The connection resistance w as evaluated for the protruding electrode 12 and the flat electrode 13 facing each other, and also the insulation resistance between adjacent protruding electrodes 12, 12 was evaluated. The connection resistance was 1 $\Omega$ or less while the insulation resistance was 1010 $\Omega$ or more, and these values remained almost the same even after a 1000-hour high-temperature humidity test at 85° C. and 85% RH, proving satisfactory long-term reliability.

In this example, the average number of effective particles that contributed to the connection with the electrode (diameter: 50 $\mu$m=1962.5 $\mu$m 2 )was 20 (maximum: 23 particles; minimum: 18 particles).

In this regard, only those particles which were glossy due to contact with the electrode when the connection surface was observed from the glass side by using a microscope (×100) were counted as the effective particles contributing to the connection. The ratio L/D was 1.0, since the diameter was 50 $\mu$m.

According to Example 1, the particles on each protruding electrode 12 had been deformed by compression and were in contact with and held between the corresponding pair of upper and lower electrodes.

No air bubbles were contained in the region between adjacent protruding electrodes 12, 12, and satisfactory long-term reliability could be achieved. The extent to which the conducting particles 3 were deformed varied in accordance with variations in the distance between the bump electrode 12—flat electrode 13 pairs facing each other, and some particles were stuck into the bump electrodes. Satisfactory connection could be achieved for all electrodes.

Table 1 given hereinafter shows the measured values of the viscosity (binder viscosity) of the second adhesive 1, the viscosity difference in molten state relative to the first adhesive (the difference by which the viscosity of the second adhesive is lower than that of the first adhesive), and the average number of effective particles on the electrode that contributed to the electrical connection with the electrode.

Comparative Example 1

In Comparative Example 1, a single-layer connection sheet conventionally known, which had no first insulating adhesive layer and included only a second adhesive layer containing a conductive material, was produced.

Specifically, a solution containing 30% of ethyl acetate was obtained by mixing, in the ratio of 30/70, the phenoxy resin (polymeric epoxy resin) (PKHA from Union Carbide Corporation) and the liquid epoxy resin (NOVACURE HX-3921 from Asahi Chemical Industry Co., Ltd.; epoxy equivalent: 185; activation temperature: 118° C.) containing a microcapsule latent hardener, both used in Example 1. To this solution was added 8% by volume of conducting particles, which were obtained by coating polystyrene particles (GELPACK from Hitachi Chemical Co., Ltd.) having a particle diameter of 4±0.2 μm with Ni/Au in thicknesses of 0.2/0.02 μm, followed by mixing and dispersion of the conducting particles. The dispersion was applied to a separator (polyethylene terephthalate film treated with silicone; thickness: 40 μm) by means of a roll coater, and the separator applied with the dispersion was dried at 110° C. for 20 minutes to obtain a second adhesive layer 1 with a thickness of 20 μm.

Namely, the connection sheet of Comparative Example 1 included the 20 μm-thick second adhesive layer alone.

Subsequently, under the same conditions as employed in Example 1, an IC chip for evaluation and thin-film flat electrodes were connected to each other with the connection sheet therebetween, to obtain a connected body.

Using the same evaluation methods as mentioned above, a cut face of the connected body thus obtained according to Comparative Example 1 was observed using a microscope, and the connection resistance and the insulation resistance were measured.

As a result, it was found that the number of particles on the top face (diameter: 50 μm) of a bump electrode connected to the flat electrode was 13 at the maximum and 0 at the minimum; namely, there were some flat electrode-bump electrode pairs having no effective particles therebetween for electrically connecting the two electrodes, thus showing a great difference between the maximum and minimum numbers of effective particles as compared with Example 1.

Further, short circuit occurred during the measurement of the insulation resistance of the connected body. This was probably caused due to flow of conducting particles from the top faces of the electrodes during the connection step, thus failing to maintain the insulating property between adjacent electrodes.

Example 2

A connection sheet was obtained in the same manner as in Example 1, but in this example, another first adhesive layer was formed on the other side of the second adhesive layer, following the same process as employed in Example 1. Namely, a multi-layer connection sheet 10 including three layers as shown in FIG. 2 was obtained.

Also, in place of flat electrodes on glass used in Example 1, a double-layer FPC (flexible printed circuit) board was used which had a copper circuit of 18 μm high on a polyimide film. Following the same procedure as employed in Example 1, the electrodes were connected to obtain a connected body having a structure as shown in FIG. 7.

The connected body obtained according to Example 2 was evaluated as to the same features as in Example 1, and the results were substantially identical with those obtained by Example 1. Specifically, the connection resistance was 1 Ω or less, the insulation resistance was $10^{10}$ Ω or more, and these values remained almost the same even after a 1000-hour high-temperature humidity test at 85° C. and 85% RH, proving satisfactory long-term reliability.

In this example, the average number of effective particles on the electrode (diameter: 50 μm=1962.5 μm²) that contributed to the connection was 16 (maximum: 21 particles; minimum: 10 particles).

The ratio L/D was 1.0, because the electrode diameter was 50 μm.

The results of evaluation relating to Example 2 are also shown in Table 1.

In Example 2, ten or more effective particles could be trapped on every electrode, despite the structure in which particles are liable to flow because protruding electrodes are connected to each other.

Examples 3 to 5

In Examples 3 to 5, connection sheets were obtained following the same procedure as employed in Example 1, but the mixing ratio between the phenoxy resin and the liquid epoxy resin was changed for the first and second adhesive layers 2 and 1 to vary the viscosity difference at 150° C. between the two layers.

Specifically, in Example 3, the second adhesive layer had a viscosity of 200 poises and the viscosity difference was 0.

In Example 4, the second adhesive layer had a viscosity of 200 poises and the viscosity difference was 1.

As shown in Table 1, the average number of effective particles was 13 (11 to 15) for Example 3 and 19 (17 to 22) for Example 4.

Thus, according to these examples, many effective particles could be trapped on electrodes with relatively small variation and, like Example 1, satisfactory connection characteristics could be obtained, as will be seen from Table 1.

Comparative Examples 2 and 3

In Comparative Examples 2 and 3, connection sheets having a double-layer structure like Example 1 were produced, but the mixing ratio between the phenoxy resin and the liquid epoxy resin was changed for the first and second adhesive layers 2 and 1 to vary the viscosity difference between the two layers at 150° C.

Specifically, in Comparative Example 2, the second adhesive layer had a viscosity of 80 poises and the viscosity difference was 10,000 poises.

In Comparative Example 3, the second adhesive layer had a viscosity of 200 poises and the viscosity difference was −120. The viscosity difference of −120 indicates that, in Comparative Example 3, the viscosity of the second adhesive in the second adhesive layer 1 containing the conductive material was higher by 120 poises than that of the first insulating adhesive layer 2.

Also, in Comparative Examples 2 and 3, the ratio L/D was 1.0 because the electrode diameter was 50 μm.

As shown in Table 1, the average number of effective particles was zero (Comparative Example 2) or was very small (Comparative Example 3).

In Comparative Example 2, since the viscosity difference was too large, the conducting particles could not be exposed to the first adhesive layer and no effective particles were present on the electrodes, so that the connection failed.

The connection sheet according to Comparative Example 3 had a double-layer structure known in the art, but had entirely opposite viscosity distribution with respect to Example 1. For this reason, the average number of effective particles was small and there were some electrode pairs having no effective particles therebetween. Also, there was a large difference between the maximum and minimum numbers of effective particles, compared with Example 1.

TABLE 1

| | Viscosity of First Adhesive (poise) | Viscosity Difference (poise) | Average Number of Effective Particles on Electrode (particles/1962.5 $\mu m^2$) |
|---|---|---|---|
| Example 3 | 200 | 0 | 13 (11 to 15) |
| Example 4 | 200 | 1 | 19 (17 to 22) |
| Example 1 | 80 | 200 | 20 (18 to 23) |
| Example 2 | 80 | 200 | 16 (10 to 21) |
| Example 5 | 80 | 1,000 | 16 (16 to 22) |
| Comparative Example 2 | 80 | 10,000 | None |
| Comparative Example 3 | 200 | −120 | 6 (0 to 14) |

Examples 6 to 9

In Examples 6 to 9, connection sheets produced in the same manner as in Example 1 were used, but electrodes to be connected had different shapes. Specifically, by changing the shape of each bump electrode on the connection surface of an IC chip, the longer side-to-shorter side ratio L/D was varied within the range of 1 to 20.

In Example 6, the longer side L and shorter side D of the bump electrode were 50 $\mu m$ each, and thus the ratio L/D was 1.41.

In Example 7, the longer side L and shorter side D of the bump electrode were 20 $\mu m$ and 100 $\mu m$, respectively, and thus the ratio L/D was 5.0.

In Example 8, the longer side L and shorter side D of the bump electrode were 20 $\mu m$ and 200 $\mu m$, respectively, and thus the ratio L/D was 10.0.

In Example 9, the longer side L and shorter side D of the bump electrode were 10 $\mu m$ and 200 $\mu m$, respectively, and thus the ratio L/D was 20.0.

Each of the bump electrodes was formed in such a manner that its longer side L was directed perpendicularly to a center line N of the IC chip, as shown in FIG. 10. The measurement results are shown in Table 2 below.

As seen from Table 2, in these examples in which the ratio L/D was varied in the range of 1 to 20, many effective particles could be trapped on the electrodes with relatively small variations, and satisfactory connection characteristics could be obtained as in Example 1.

Comparative Examples 4 and 5

In Comparative Examples 4 and 5, FPC boards as used in Example 2 were connected to each other for parallel electrode connection (electrode width D=50 $\mu m$; connection width L=1500 $\mu m$; L/D=30).

In Comparative Example 4, a connection sheet produced in the same manner as in Example 1 was used for the connection, but the average number of effective particles on the electrode was 9 (0 to 16) per 1962.5 $\mu m^2$, which is smaller than ½ of the average number obtained by Example 1.

In Comparative Example 5, a connection sheet (viscosity of the second adhesive: 200 poises; viscosity difference: −120) produced in the same manner as in Comparative Example 3 was used for the connection. The average number of effective particles was 18 (14 to 24), which is greater than the average number obtained by Comparative Example 3.

The results of experiments described above reveal that an optimum structure for the connection sheet differs depending on whether the connection sheet is applied to the connection of parallel electrodes with a large L/D ratio, like the electrodes on a circuit board, or to the connection of dot-like electrodes with a small L/D ratio, like the electrodes on a semiconductor chip. The reason is not known, but presumably the heat transmission property and the flow of the adhesive during the connection step vary under the influence of L/D.

TABLE 2

| | Shape of Bump ($\mu m$) | Longer side-to-Shorter side Ratio (L/D) | Average Number of Effective Particles on Electrode (particles/1962.5 $\mu m^2$) |
|---|---|---|---|
| Example 6 | 50 × 50 | 1.0 | 24 (22 to 27) |
| Example 7 | 20 × 100 | 5.0 | 162 (141 to 182) |
| Example 8 | 20 × 200 | 10.0 | 245 (228 to 253) |
| Example 9 | 10 × 200 | 20.0 | 121 (112 to 138) |
| Comparative Example 4 | 50 × 1500 | 30.0 | 9 (0 to 16) |
| Comparative Example 5 | 50 × 1500 | 30.0 | 18 (14 to 24) |

Example 10

Following the same procedure as employed in Example 1, a connection sheet was produced, but no bumps were formed for the electrodes on an IC chip. Specifically, the chip used was a semiconductor chip having a structure as shown in FIG. 8, wherein pads were formed on required portions of Al wiring and the chip surface except for the pads was coated with a 1 $\mu m$-thick insulating layer (in this example, $SiO_2$ layer), thus forming recessed electrodes. The connection sheet was temporarily bonded to the semiconductor chip with its second adhesive layer facing the chip.

In Example 10, the connection resistance was 1 $\Omega$ or less, the insulation resistance was $10^{10}$ $\Omega$ or more, and these values remained almost the same even after a 1000-hour high-temperature humidity test at 85° C. and 85% RH, showing satisfactory connection characteristics as in Example 1. The average number of effective particles that contributed to the connection with the electrodes was 25 (maximum: 29 particles; minimum: 22 particles/1962.5 $\mu M^2$)). Further, Example 10 is excellent from the economical viewpoint, because it is unnecessary to form protruding electrodes on a chip or the like.

Example 11

A connection sheet having the same structure as that of Example 2 was used, but the particle diameter of the conducting particles was 7 $\mu m$ and the thickness of the second adhesive layer 1 was also 7 $\mu m$. A first adhesive layer 2 on one side of the connection sheet had a thickness of 25 $\mu m$, and the other first adhesive layer on the other side of the connection sheet had a thickness of 50 $\mu m$.

Electrodes to be connected were leads (thickness: 100 $\mu m$; pitch: 300 $\mu m$; electrode width: 350 $\mu m$; connection width: 3000 $\mu m$; L/D=8.6) of a QFP type IC, and were connected to copper terminals of 35 $\mu m$ thick formed on a glass epoxy substrate.

The connection structure obtained according to Example 11 was similar to that shown in FIG. 7, but had no substrate on one side thereof, that is, on the IC lead side.

This example had advantageous effects similar to those achieved by Example 1, and showed satisfactory connection characteristics without causing electrode displacement, despite the connection between electrodes having a large height. Although the conductive material in the conductive sheet is not illustrated, the particles had been deformed by compression and were held between the upper and lower electrodes in contact therewith. Also, no air bubbles were contained in the region between adjacent electrodes, and satisfactory long-term reliability could be achieved. In this example, the adhesive layer was formed also on the region where no substrate existed so as to be level with the leads, making it possible to fix the leads in position. Ten or more effective particles could be trapped on every electrode.

Examples 12 and 13

In Examples 12 and 13, connection sheets produced in the same manner as in Example 1 were used, but the electrodes were heated under pressure in two stages.

Specifically, in Example 12, a glass substrate capable of mounting five IC chips thereon was used instead of a substrate used in Example 1, and the heat-pressure application step was performed in two stages. First, the structure was heated at 150° C. under 20 kgf/mm$^2$, and upon lapse of 2 seconds, the connection resistances at respective connection points were measured by means of a multimeter while the structure was kept under pressure.

Example 13 had the same structure as Example 12, but upon lapse of 3 seconds after the start of the heat-pressure application step at 150° C. under 20 kgf/mm$^2$, the structure was removed from the connecting apparatus. Since the cohesive force of the adhesives increased due to the application of heat and pressure, the individual IC chips could be temporarily fixed on the glass substrate; therefore, with no pressure applied to the structure, the connection resistances at respective connection points were measured by means of a multimeter, as in Example 12.

In both examples, one IC chip was defective. Therefore, the defective chip was peeled off, and with a new chip set in position, the connection step mentioned above was carried out. In this case, no defect was observed in both examples. According to these examples, in the repair step in which the defective chip was peeled off and a new chip was connected therefor, the adhesives were in an insufficiently cured state; therefore, the chip could be peeled off very easily and also the subsequent cleaning with the use of acetone was easy, thus facilitating the repair work.

After the current supply inspection step and the repair step were carried out as described above, both examples were subjected to the second stage of heat-pressure application step for 15 seconds at 150° C. under 20 kgf/mm$^2$, and they both exhibited satisfactory connection characteristics. The number of effective particles was 19 or more on all bump electrodes. In Examples 12 and 13, the average number of effective particles on the protruding electrode (bump) could be increased, as compared with Example 1, and also the outflow of particles from the electrodes could be reduced. In addition, particle retentivity could be further improved presumably because the heat-pressure application step was performed in two stages.

Example 14

Example 14 was different from Example 1 in that different materials were used for the first and second adhesives.

Specifically, unlike the connection sheet of Example 1, carbonyl nickel particles (average particle diameter: 3 μm) having uneven surfaces were added in the amount of 4% by volume as the conducting particles, and the second adhesive layer had a thickness of 5 μm. Also, for the first adhesive layer, the liquid epoxy resin (epoxy equivalent: 185) containing a microcapsule latent hardener was mixed with a carboxyl modified SEBS (styrene-ethylene-butylene-styrene block copolymer) in the ratio of 20/80, to obtain a sheet with a thickness of 15 μm according to the same procedure as mentioned above, and the thus-obtained sheet and the second adhesive layer were laminated together. The viscosity of the first adhesive layer, measured by the aforementioned method, was 100 poises at 150° C., and thus the difference in viscosity between the first and second adhesive layers was 20 poises.

Example 14 was evaluated in the same manner as in Example 1; as a result, the conducting particles were slightly stuck into the electrodes and 100 or more effective particles could be trapped on the electrodes. Further, Example 14 exhibited satisfactory connection resistance, insulation resistance and long-term reliability.

In Example 14, different polymer materials were used for the first and second adhesives of the first and second adhesive layers; therefore, after the bonding, a chip could be neatly peeled off from the surface of the first adhesive layer. This means that the repair work is facilitated. The second and first adhesive layers were subjected to a tensile test according to TMA (thermomechanical analysis), and their Tg (glass transition points) were 125° C. and 100° C., respectively. This is an effective feature for the repair work in cases where the peeling is effected at a high temperature, because the difference in heat resistance between the two adhesive layers can be utilized to facilitate the peeling and also because it is easy to provide a difference in cohesive force.

Examples 15 to 17

In Examples 15 to 17, connection sheets were produced in the same manner as in Example 1, but insulating particles were also added.

In Example 15, 1% by volume of polystyrene particles, which were used as cores of the conducting particles in Example 1, were mixed and dispersed in the second adhesive layer as insulating particles, to obtain a connection sheet similar to that of Example 1.

In Example 16, 1% by volume of polystyrene particles, which were used as cores of the conducting particles in Example 1, were mixed and dispersed in the first adhesive layer as insulating particles, to obtain a connection sheet similar to that of Example 1.

In Example 17, 1% by volume of polystyrene particles, which were used as cores of the conducting particles in Example 1, were mixed and dispersed in each of the first and second adhesive layers as insulating particles, to obtain a connection sheet similar to that of Example 1.

Examples 15 to 17 were evaluated in the same manner as in Example 1, and they proved to be excellent in connection resistance (1 Q or less), insulation resistance ($10^{10}$ Ω or more), and in long-term reliability. Since the insulating particles were added only in a small quantity, no influence of the insulating particles on the flowability was observed in each example.

Especially, in Example 15, the insulating particles dispersed among the conducting particles were effective in improving the resolution of the anisotropic conductivity of the second adhesive layer alone. Example 16 could effectively retain the insulating property of the first adhesive layer, and Example 17 had the advantages of both Examples 15 and 16. In Examples 15 and 17, the insulating particles had been deformed and were held between connected electrodes facing each other, like the conducting particles.

Example 18

In this example, conducting particles, which were identical to those used in Example 1, were coated with an insulating material, to obtain a connection sheet similar to that of Example 1.

Specifically, the surfaces of conducting particles having an average particle diameter of 4 µm were coated with a nylon resin film having a thickness of about 0.2 µm and having a glass transition point of 1270C, and also the quantity of the conducting particles added was increased to 15 vol %.

This example was evaluated in the same manner as in Example 1, and exhibited satisfactory connection characteristics (connection resistance: 1 Ω or less; insulation resistance: $10^{10}$ Ω or more). In this example, the average number of particles on the electrode was remarkably increased. In the connecting portion where electrodes face each other, the insulating coating of the conducting particles held between the electrodes was melted by heat and pressure at the time of connection, permitting electrical connection, and also conductivity could be achieved due to softening of the first insulating adhesive. On the other hand, the surfaces of the conducting particles in the region between adjacent electrodes remained coated with the insulating film because of less intensive heat and pressure, thus ensuring satisfactory insulation performance. The number of effective particles was 30 or more for all bump electrodes. With the connection sheet structure according to Example 18, the concentration of the conductive material in the first adhesive could be increased.

The present invention is not limited to the embodiments and examples described above, and various modifications may be made without departing from the spirit and scope of the invention.

For example, instead of directly laying the first insulating adhesive layer and the second adhesive layer containing the conductive material one upon the other, another layer, for example, a third insulating adhesive layer having different physical properties in viscosity, adhesiveness or the like, may be interposed between the first and second adhesive layers. Also in this case, similar advantageous effects can be obtained.

Further, the viscosity of each of the first and second adhesive layers need not be uniform, and may be varied in the thickness direction. In this case, however, the viscosity of the second adhesive must be equal to or lower than that of the first adhesive when the first and second adhesive layers are in a molten state.

What is claimed is:

1. A connection sheet for interposing between electrodes facing each other to join the electrodes together for electrically connecting the electrodes to each other, comprising:
   a first layer comprising a molten first adhesive having an electrical insulating property; and
   a second layer comprising a molten second adhesive having an electrical insulating property and electrically conductive particles, the second layer being placed directly over the first layer and the molten second adhesive having a viscosity lower than that of the molten first adhesive.

2. A connection sheet according to claim 1, wherein the viscosity of the second adhesive is lower than that of the first adhesive by 1000 poises or less when the first and second adhesives are molten.

3. A connection sheet according to claim 1, wherein the viscosity of the second adhesive when molten is 500 poises or less at the time of electrode connection.

4. A connection sheet according to claim 1, wherein the first and second adhesives have different adhesive properties.

5. The connection sheet according to claim 1, wherein the first layer or the second layer or both comprise insulating particles.

6. A connection sheet according to claim 1, wherein the electrically conductive particles comprise conducting particles or conducting particles having surfaces thereof coated with an insulating material.

7. The connection sheet according to claim 1, wherein the first layer further comprises a separator sheet which covers a surface of the first layer opposite the second layer and which can be peeled off from the first layer.

8. A connection structure for joining together electrodes facing each other to electrically connect the electrodes to each other, comprising:
   a first layer comprising a molten first adhesive having an electrical insulating property;
   a second layer comprising a molten second adhesive having an electrical insulating property and electrically conductive particles, the second layer being placed directly over the first layer and the molten second adhesive having a viscosity lower than that of the molten first adhesive; and
   a substrate in contact with the first layer or the second layer, the substrate comprising an electrode having an electrode surface which is in contact with the electrically conductive particles, the electrode surface having a longer side and a shorter side, the ratio (L/D) of the longer side (L) to the shorter side (D) of the electrode surface being 20 or less.

9. A connection structure according to claim 8, wherein the viscosity of the second adhesive is lower than that of the first adhesive by 1000 poises or less when the first and second adhesives are molten.

10. A connection structure for joining together electrodes facing each other to electrically connect the electrodes to each other, comprising;
    a first layer comprising a molten first adhesive having an electrical insulating property;
    a second layer comprising a molten second adhesive having an electrical insulating property and electrically conductive particles, the second layer being placed directly over the first layer and the molten second adhesive having a viscosity lower than that of the molten first adhesive; and
    a pair of electrode rows which face each other and between which the first and second layers are interposed, at least one of the pair of electrode rows having protruding electrodes protruding from a substrate, the protruding electrodes each having a base near the substrate and a top face facing a corresponding electrode, the first layer surrounding at least the base of each of the protruding electrodes.

11. A connection structure according to claim 10, wherein the second adhesive is lower in viscosity than the first adhesive by 1000 poises or less when the first and second adhesives are molten.

12. The connection structure according to claim 11, wherein the electrically conductive particles of the second layer have a distribution density which decreases with distance from the top face of each protruding electrode toward the base thereof.

13. A connection sheet for interposing between electrodes facing each other to join the electrodes together for electrically connecting the electrodes to each other, comprising:

a first layer comprising a molten first adhesive having an electrical insulating property; and a second layer comprising a molten second adhesive having an electrical insulating property and electrically conductive particles, the second layer being placed directly over the first layer and the molten first adhesive and molten second adhesive having different adhesive properties.

14. The connection sheet according to claim 13, wherein the viscosity of the molten second adhesive is 500 poises or less.

15. The connection sheet according to claim 13, wherein the first layer or the second layer or both comprise insulating particles.

16. The connection sheet according to claim 13, wherein the electrically conductive particles comprise conducting particles or conducting particles having surfaces thereof coated with an insulating material.

17. The connection sheet according to claim 13, wherein the first layer further comprises a separator sheet which covers a surface of the first layer opposite the second layer and which can be peeled off from the first layer.

18. A connection structure for joining together electrodes facing each other to electrically connect the electrodes to each other, comprising:

a first layer comprising a molten first adhesive having an electrical insulating property;

a second layer comprising a molten second adhesive having an electrical insulating property and electrically conductive particles, the second layer being placed directly over the first layer and the molten first and the molten second adhesive having different adhesive properties; and a substrate in contact with the first layer or the second layer, the substrate comprising an electrode having an electrode surface which is in contact with the electrically conductive particles, the electrode surface having a longer side and a shorter side, the ratio (L/D) of the longer side (L) to the shorter side (D) of the electrode surface being 20 or less.

19. A connection structure for joining together electrodes facing each other to electrically connect the electrodes to each other, comprising;

a first layer comprising a molten first adhesive having an electrical insulating property;

a second layer comprising a molten second adhesive having an electrical insulating property and electrically conductive particles, the second layer being placed directly over the first layer and the molten first and the molten second adhesives having different adhesive properties; and a pair of electrode rows which face each other and between which the first and second layers are interposed, at least one of the pair of electrode rows having protruding electrodes protruding from a substrate, the protruding electrodes each having a base near the substrate and a top face facing a corresponding electrode, the first layer surrounding at least the base of each of the protruding electrodes.

20. The connection structure according to claim 19, wherein the electrically conductive particles of the second layer have a distribution density which decreases with distance from the top face of each protruding electrode toward the base thereof.

* * * * *